US010341768B2

(12) United States Patent
Hu et al.

(10) Patent No.: US 10,341,768 B2
(45) Date of Patent: Jul. 2, 2019

(54) SPEAKER ADAPTATION WITH VOLTAGE-TO-EXCURSION CONVERSION

(71) Applicant: Cirrus Logic International Semiconductor Ltd., Edinburgh (GB)

(72) Inventors: Rong Hu, Austin, TX (US); Roberto Napoli, Milan (IT); Jie Su, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 80 days.

(21) Appl. No.: 15/805,901

(22) Filed: Nov. 7, 2017

(65) Prior Publication Data

US 2018/0160228 A1 Jun. 7, 2018

Related U.S. Application Data

(60) Provisional application No. 62/428,624, filed on Dec. 1, 2016.

(51) Int. Cl.
*H03G 11/00* (2006.01)
*H04R 3/00* (2006.01)
*H04R 29/00* (2006.01)

(52) U.S. Cl.
CPC ........... *H04R 3/007* (2013.01); *H04R 29/001* (2013.01); *H04R 2430/01* (2013.01)

(58) Field of Classification Search
CPC ...................................................... H03G 11/00
See application file for complete search history.

(56) References Cited

U.S. PATENT DOCUMENTS 5,815,585 A 9/1998 Klippel
10,149,051 B2 * 12/2018 Thyssen ................ H04R 3/007
(Continued)

FOREIGN PATENT DOCUMENTS

EP 2538699 A1 12/2012
WO 2011076288 A1 6/2011
(Continued)

OTHER PUBLICATIONS

Small, Richard. "Vented-Box Loudspeaker Systems Part IV: Appendices," Journal of Audio Engineering , vol. 21(8), pp. 635-639 (Oct. 1973).
(Continued)

*Primary Examiner* — Olisa Anwah
(74) *Attorney, Agent, or Firm* — Norton Rose Fulbright US LLP

(57) ABSTRACT

A speaker model may implement a direct voltage-to-excursion model in an adaptive filter for modeling the speaker without developing a first electrical-only model and then converting the model to a mechanical model. The voltage-to-excursion model may allow for modeling of different kinds of speakers, such as sealed, ported, or vented speakers. A transfer function may be developed in the adaptive filter for the voltage-to-excursion model, and that transfer function re-used for prediction of excursion values based on an audio signal. Speaker protection may be performed to take steps to prevent speaker damage when a predicted excursion value exceeds safe limits. The voltage-to-excursion model may operate in displacement or displacement-related domains (e.g., velocity and back emf).

22 Claims, 8 Drawing Sheets

(56) References Cited

U.S. PATENT DOCUMENTS

| | | | | |
|---|---|---|---|---|
| 2011/0228945 A1* | 9/2011 | Mihelich | H04R 3/002 381/59 |
| 2012/0106750 A1* | 5/2012 | Thormundsson | H04R 3/007 381/71.12 |
| 2012/0121098 A1 | 5/2012 | Gautama | |
| 2012/0179456 A1 | 7/2012 | Ryu | |
| 2014/0254804 A1 | 9/2014 | Su | |
| 2015/0086025 A1* | 3/2015 | Oyetunji | H04R 3/007 381/55 |

FOREIGN PATENT DOCUMENTS

| | | |
|---|---|---|
| WO | 2012/066029 A1 | 5/2012 |
| WO | 2015/041765 A1 | 3/2015 |

OTHER PUBLICATIONS

Small, Richard. "Vented-Box Loudspeaker Systems Part III: Synthesis," Journal of Audio Engineering, vol. 21(7), pp. 549-554 (Sep. 1973).

Small, Richard. "Vented-Box Loudspeaker Systems Part II: Large-Signal Analysis," Journal of Audio Engineering, vol. 21(6), pp. 438-444 (Aug. 1973).

Small, Richard. "Vented-Box Loudspeaker Systems Part I: Small-Signal Analysis," Journal of Audio Engineering, vol. 21(5), pp. 363-372 (Jun. 1973).

Thiele, A. "Loudspeakers in Vented Boxes: Part I," Journal of Audio Engineering, vol. 19(5), pp. 382-392 (May 1971).

Knudsen, M., et al. "Determination of Loudspeaker Driver Parameters Using a System Identification Technique," Journal of Audio Engineering, vol. 37(9), pp. 700-708 (Sep. 1989).

Bright, A. "Compensating Non-Linear Distortion in an 'Equal-Hung' Voice Coil," AES 111th Convention (New York, NY), pp. 1-8 (Sep. 21-24, 2001).

Bright, A. "Tracking Changes in Linear Loudspeaker Parameters with Current Feedback," AES 115th Convention (New York, NY), pp. 1-11 (Oct. 10-13, 2003).

Bright, A. "Discrete-time loudspeaker modelling," AES 114th Convention (Amsterdam, The Netherlands), pp. 1-25 (Mar. 22-25, 2003).

Thiele, A. "Loudspeakers in Vented Boxes: Part II," Journal of Audio Engineering, vol. 19(6), pp. 192-204 (May 1971).

* cited by examiner

SPEAKER ADAPTATION WITH VOLTAGE-TO-EXCURSION CONVERSION

CROSS-REFERENCE TO RELATED PATENT APPLICATIONS

This application claims the benefit of priority of U.S. Provisional Patent Application No. 62/428,624 to Hu et al. filed on Dec. 1, 2016, and entitled "Speaker Adaptation with Voltage-to-Excursion Conversion," which is hereby incorporated by reference in its entirety.

FIELD OF THE DISCLOSURE

The instant disclosure relates to audio output using speakers. More specifically, portions of this disclosure relate to speaker protection.

BACKGROUND

Electronic devices, such as smartphones and other portable media devices, often include a speaker for reproducing sounds, such as speech from a telephone call or music from an audio/video file. Some such electronic devices are sized for portability, and thus include a microspeaker for the reproduction of sounds. The use of microspeakers presents challenges in that microspeakers can be highly variable in quality. One concern regarding microspeakers is over-excursion. Speakers reproduce sounds by driving a cone forwards and backwards to produce soundwaves. Over-excursion occurs when a signal driving the cone of the microspeaker causes the cone to extend beyond a safe operating region. Over-excursion may result in the cone making contact with a speaker casing and damaging the cone, permanently reducing the quality of output from the speaker. Furthermore, small electronic devices attempt to make up for the microspeaker's size by overdriving the microspeaker to maximize loudness. Conventionally, protection algorithms analyze the overdriving and attempt to prevent overdriving that can damage the microspeaker.

Conventional techniques for handling or preventing over-excursion include the use of speaker model within a speaker monitoring circuit. The speaker model may include a displacement model that estimates the cone displacement based on factors relating to operation of a speaker. The estimates may be used to determine and prevent speaker over-excursion. Existing displacement models operate by determining an electrical model of the speaker and converting the electrical model to a mechanical model. As shown in FIG. 1A, an adaptive filter Ha(s) may be developed using a monitored voltage and current for the speaker. The adaptive filter Ha(s) is an electrical model of the speaker. The Ha(s) model may be converted to obtain a mechanical model Hx(s). That mechanical model Hx(s) may be used to predict cone displacement based on an input audio signal S(t). An alternate conventional approach is shown in FIG. 1B. An adaptive filter Ha(s) may be developed using a monitored voltage and current for the speaker. Parameters are extracted from the adaptive filter Ha(s) and converted to form filter coefficients of a mechanical model Hx(s). That Hx(s) model is used to predict cone displacement based on an input audio signal S(t).

Each of these conventional techniques involves forming an electrical model of the speaker represented by an adaptive filter and converting that electrical model to a mechanical model capable of estimating cone displacement. However, the conversion process can be cumbersome. Furthermore, the conversion from electrical to mechanical parameters may require input regarding the mechanical parameters of the speaker. Thus, the conversion is not well-suited for operating on a wide range of types of speakers. For example, microspeakers are available in sealed-box and vented-box varieties that each have different mechanical parameters.

Shortcomings mentioned here are only representative and are included simply to highlight that a need exists for improved electrical components, particularly for audio circuitry for speaker monitoring and speaker protection employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

A speaker model may implement a voltage-to-excursion model capable of supporting different speaker types. The voltage-to-excursion model may be developed in an adaptive filter for modeling the speaker without developing a first electrical-only model and then converting the model to a mechanical model. Instead, the voltage-to-excursion model may convert from electrical signals, such as the voltage and current monitored for the speaker, directly to an estimated excursion. The voltage-to-excursion model may allow for modeling of different kinds of speakers, such as sealed, ported, or vented speakers. A voltage-to-excursion model may be generated by creating an error signal from one or more of several different parameters and feeding back the error signal to the adaptive filter to update the model. For example, the error signal may be based on an estimated velocity, back emf (electromagnetic force), and/or excursion. In some embodiments, the voltage-to-excursion model may be partially parametric by generally using only electrical parameters of the speaker with few mechanical parameters (e.g., only Bl of the speaker) or without information regarding mechanical parameters related to moving mass (Mms), stiffness (Kms), and mechanical resistance (Rms).

Electronic devices incorporating the speaker modeling described herein may benefit from improved sound quality and lifespan in components of integrated circuits in the electronic devices. The voltage-to-excursion model may be used to predict mechanical parameters, such as excursion. When the predicted excursion exceeds a certain threshold, a speaker protection circuit may take steps to prevent damage to the speaker resulting from the exceeded threshold. For example, the speaker protection circuit may mute audio for a portion of the output or decrease amplification gain for a portion of the output.

The voltage-to-excursion model or excursion estimate may be used to determine whether the speaker is operating as a ported speaker, sealed speaker, or vented speaker. A comparison of a current state of the adaptive speaker model used for excursion estimates with predetermined models for these speaker behaviors or other speaker conditions may be used to determine a condition of the speaker. The behavior of the speaker may be manipulated according to the known condition of the speaker (e.g., ported, sealed, vented) to improve audio quality for reproduced sounds and/or to protect the speaker by preventing likelihood of damage from speaker over-excursion.

Electronic devices may include integrated circuits (ICs) that perform the described operations. The integrated circuits may include circuitry, such as a digital signal processor (DSP), for performing the speaker modeling. The DSP may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. In some embodiments, the DSP may be integrated with other components, such as an application processor (AP) in a smartphone or graphics processing unit (GPU) in media devices.

According to one embodiment, a method may include receiving a current and a voltage for a transducer; applying the voltage to a voltage-to-displacement adaptive filter; estimating an error signal eX(t) based on the current and voltage and an output of the voltage-to-displacement adaptive filter; applying the estimated error signal to update the voltage-to-displacement adaptive filter; and/or determining a speaker type (e.g., ported, sealed, or vented) based on the error signal. The method may also include computing a back-EMF voltage based on the current and the voltage through the transducer; computing a back-EMF voltage based on the current and the voltage through the transducer; and/or computing a velocity signal based on the current and the voltage through the transducer. The transfer function of the voltage-to-displacement adaptive filter may be reused for a computation of another parameter, such as a computation of diaphragm excursion (Xpred(t)). The calculated diaphragm excursion may be used for speaker protection. According to another embodiment, an apparatus may include an audio controller configured to perform some or all of the steps described above regarding the method.

The term “determining” is used to encompass any process that produces a result, such as a producing a numerical result or producing a signal waveform. Thus, “determining” can include calculating, computing, processing, deriving, investigating, looking up (e.g., looking up in a table, a database or another data structure), ascertaining, and the like. Also, “determining” can include receiving (e.g., receiving information), accessing (e.g., accessing data in a memory), and the like. Furthermore, “determining” can include resolving, selecting, choosing, establishing, identifying, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1A:
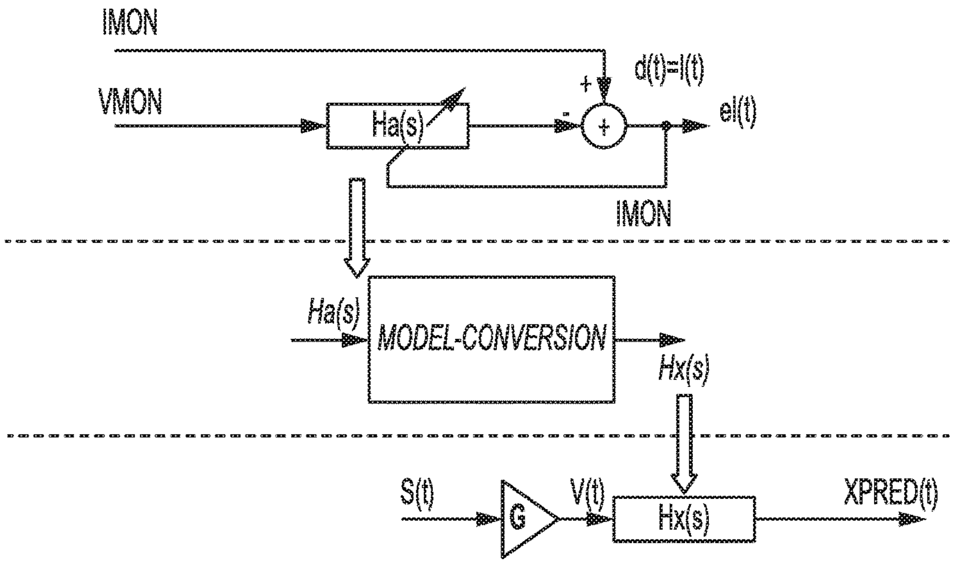
FIG. 1A PRIOR ART
FIG. 1A is speaker modeling for obtaining predicted cone excursions according to the prior art.
Figure 1B:
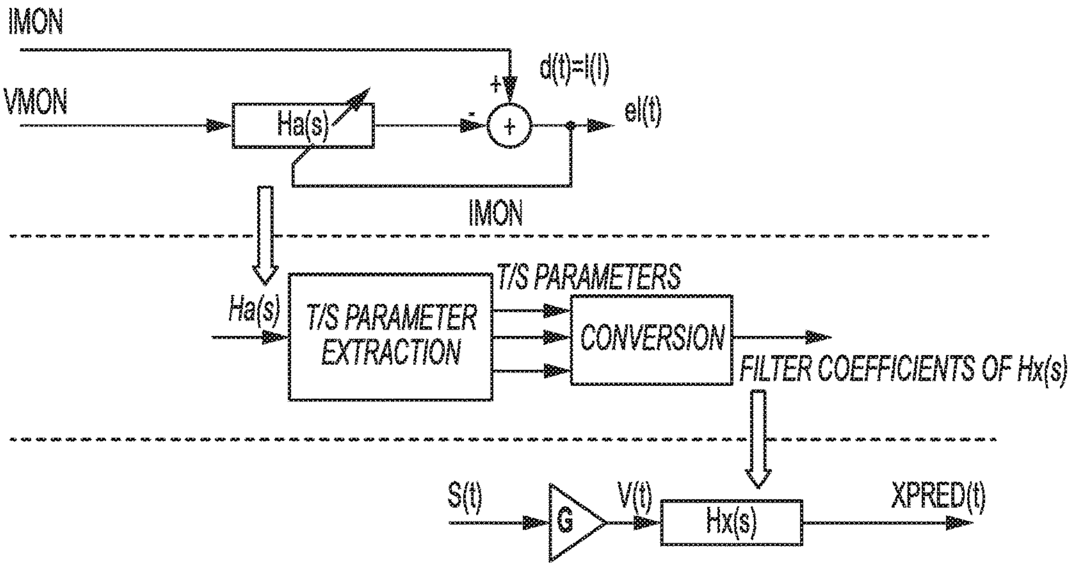
FIG. 1B PRIOR ART
FIG. 1B is speaker modeling for obtaining predicted cone excursions according to the prior art.
Figure 2A:
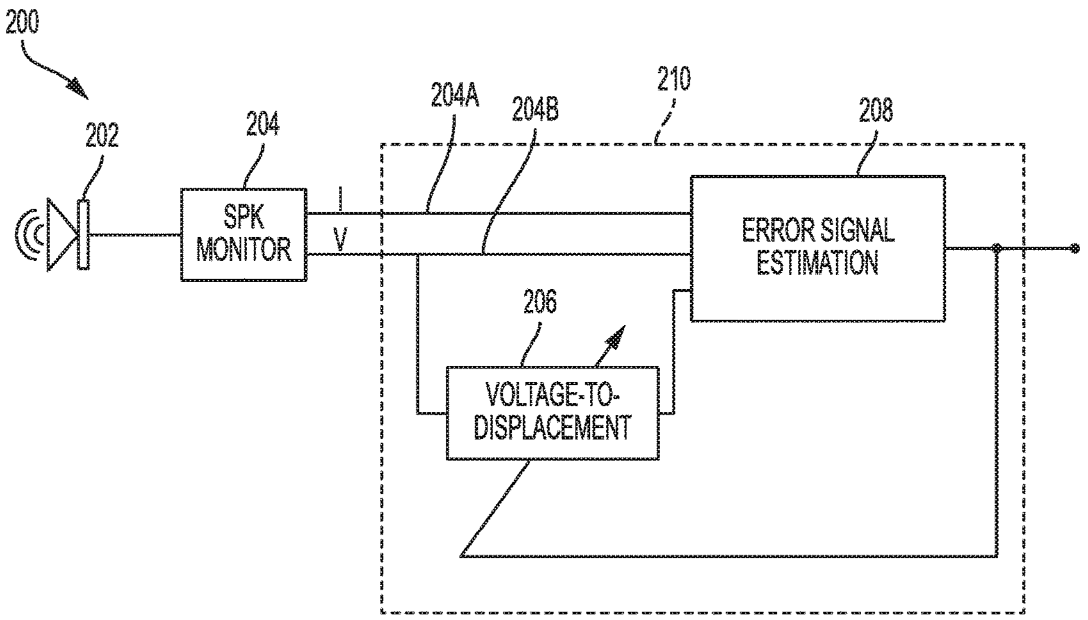
FIG. 2A is a block diagram illustrating an example speaker model for direct voltage-to-excursion speaker modeling according to some embodiments of the disclosure.

FIG. 2A is a block diagram illustrating an example speaker model for direct voltage-to-excursion speaker modeling according to some embodiments of the disclosure. A circuit 200 may include a transducer 202, such as a microspeaker of a smartphone, coupled to a speaker monitor block 204. The speaker monitor block 204 may be, for example, a resistor coupled in series between the speaker 202 and an amplifier circuit (not shown) driving the speaker 202. The speaker monitor block 204 may output a current value $I_{spk}$ 204A through the speaker 202 and a voltage value $V_{spk}$ 204B across the speaker 202. The current value $I_{spk}$ 204A and voltage value $V_{spk}$ 204B may be used by a speaker modeling block 210. The speaker modeling block 210 may model one or more characteristics of the speaker 202, such as cone excursion.

The speaker model may be implemented as an adaptive filter, such as a finite impulse response (FIR) or infinite impulse response (IIR) filter. For example, the speaker modeling block 210 may include an adaptive filter 206. The adaptive filter 206 may be configured to convert directly from a voltage domain to a displacement domain, or some conversion directly from an electrical input value to a mechanical output value. In one embodiment, the adaptive filter 206 receives the voltage value $V_{spk}$ 204B and generates a displacement value X for the speaker 202. The speaker modeling block 210 may also include an error signal estimation block 208 configured to generate an error signal indicating a difference between an estimated excursion value $X_{est}$ (based on the $I_{spk}$ and $V_{spk}$ values) and the excursion value X. The error signal may be provided as a feedback signal to the adaptive filter 206 to adapt the filter and modify the prediction process. The error signal may also or alternatively be used to determine a speaker type (e.g., ported, vented, or sealed) or determine other speaker conditions. The adaptive filter 206 receives only electrical parameters, e.g., current value $I_{spk}$ and voltage value $V_{spk}$, and produces a mechanical parameter, e.g., excursion X. In other embodiments, the adaptive filter 206 may receive other electrical parameters, such as any of current, voltage, resistance, inductance, and the like, and directly convert one or more of those electrical parameters to a mechanical value. Because the adaptive filter 206 is trained to convert directly from electrical to mechanical parameters, the transfer function of the adaptive filter 206 may be re-used for prediction of future excursion values $X_{pred}$ for the speaker without further adaptation or conversion of the transfer function.

Figure 2B:
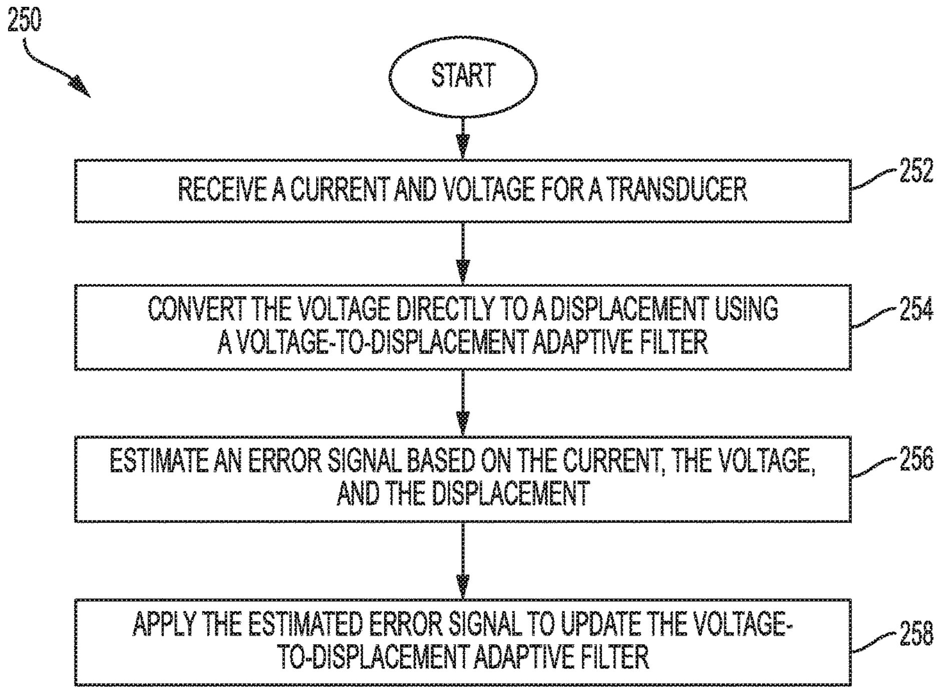
FIG. 2B is a flow chart illustrating an example method for direct voltage-to-excursion speaker modeling according to some embodiments of the disclosure.

The processing performed by the speaker monitoring block 210 may be implemented through digital circuitry, analog circuitry, and/or a combination of analog and digital circuitry. For example, processing for the speaker monitoring block 210 may be programmed as firmware or software for execution by a digital signal processor (DSP) or other processor. The DSP may be integrated with one or more other functionality for audio processing in an audio controller integrated circuit (IC). FIG. 2B is a flow chart illustrating an example method for direct voltage-to-excursion speaker modeling according to some embodiments of the disclosure. The method of FIG. 2B may be programmed for a DSP, other processor, or other processing circuitry.

A method 250 may begin at block 252 with receiving a current value and a voltage value from a transducer, such as a microspeaker of a smart phone. The method 250 may continue to block 254 with converting the voltage value directly to a displacement value using a voltage-to-displacement adaptive filter. Block 254 may include a direct conversion from one or more electrical signals, such as voltage, to a mechanical signal, such as displacement. Then, at block 256, an error signal is estimated based on the received current value and received voltage value of block 252 and the determined displacement of block 254. At block 258, the error signal may be applied to the adaptive filter to update the voltage-to-displacement adaptive filter. Block 258 may include updating a transfer function, such as updating coefficients of the transfer function, based on the error signal. The voltage-to-displacement adaptive filter described throughout method 250 may be re-used for calculating a predicted mechanical value, such as a predicted excursion value $X_{pred}$. In some embodiments, the transfer function for the adaptive filter updated through the process of blocks 252, 254, 256, and 258 may be reapplied to the calculation of another mechanical signal, such as a predicted excursion value $X_{pred}$. The predicted excursion value $X_{pred}$ may be used to control speaker operation, such by changing audio processing of an input audio signal to reduce signal amplitude when a prediction indicates an over-excursion event may occur. In some embodiments, the audio processing may use the predicted excursion value $X_{pred}$ to increase signal amplitude when the prediction indicates additional safety margin is available in operating the speaker.

Figure 3A:
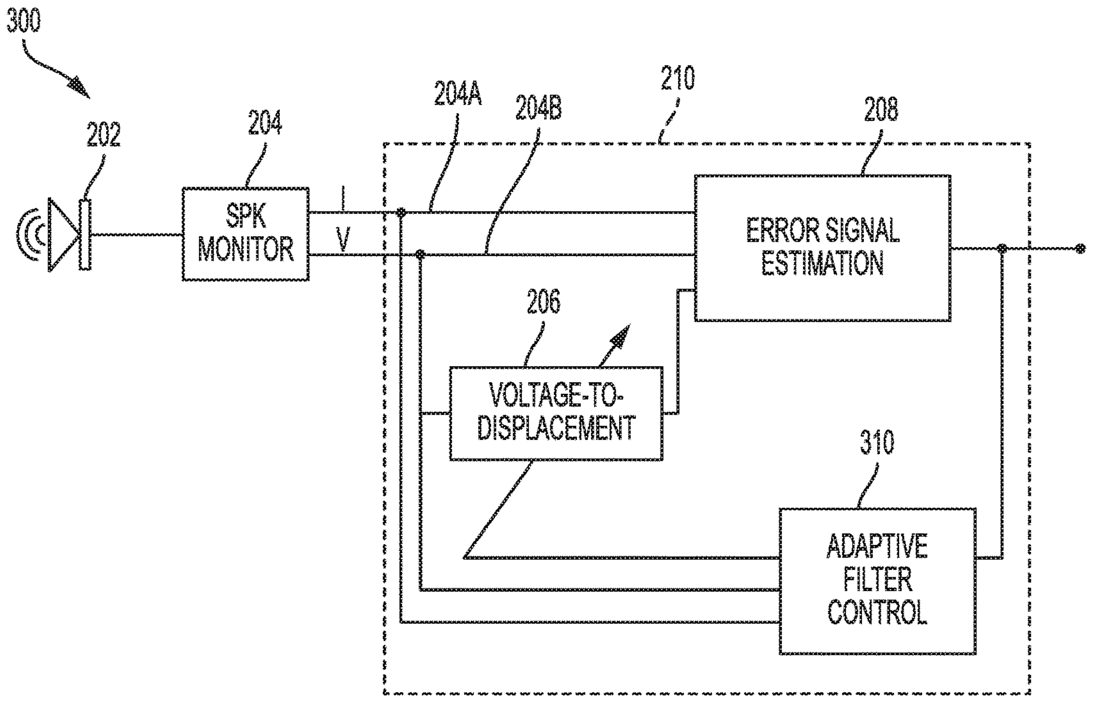
FIG. 3A is a block diagram illustrating an example speaker model for direct voltage-to-excursion speaker modeling with adaptive filter control according to some embodiments of the disclosure.

An adaptive filter control may be added to the speaker modeling described above, as shown in FIG. 3A and FIG. 3B. FIG. 3A is a block diagram illustrating an example speaker model for direct voltage-to-excursion speaker modeling with adaptive filter control according to some embodiments of the disclosure. The circuit 300 is similar to the circuit 200, but includes an adaptive filter control block 310 coupled between the adaptive filter 206 and the output of error signal estimation block 208. In one example, the adaptive filter control 310 may be coupled between the filter 206 and the estimation block 208 such that the adaptive filter control block 310 can directly modify input to the adaptive filter 206 as shown in FIG. 3A. In another example, the adaptive filter 310 may be coupled between the filter 206 and the estimation block 208 in parallel with a direct feedback from the block 208 to the filter 206. In this configuration, the adaptive filter control block 310 may provide control signals to the adaptive filter 206 to instruct the filter 206 how to respond to the error signal output by the estimation block 208.

The adaptive filter control block 310 may control, in part or in whole, how the adaptive filter 206 responds to the error signal from error signal estimation block 208. For example, the control block 310 may turn on and off the adaptive component in the adaptive filter 206. Turning off the adaptive component may prevent the adaptive filter 206 from drifting away from a desired value when any of the input signals or computations within the circuit 300 are unreliable. For example, if the $I_{spk}$ and $V_{spk}$ signals 204A-B are too low or unreliable (e.g. stuck at a certain digital value), the control block 310 may stop the adaptation in the filter 206. As another example, if the resulting excursion estimate and/or excursion calculated through back-EMF is low, then the calculations may be considered noisy and the adaptation of the filter 206 may be stopped. The control block 310 may determine a reliability for the excursion estimates (both from the adaptive filter 206 and from the error signal estimation 208), such that a transfer function Hx(s) of the adaptive filter 206 is updated (and re-used) only when it is reasonably accurate.

Figure 3B:
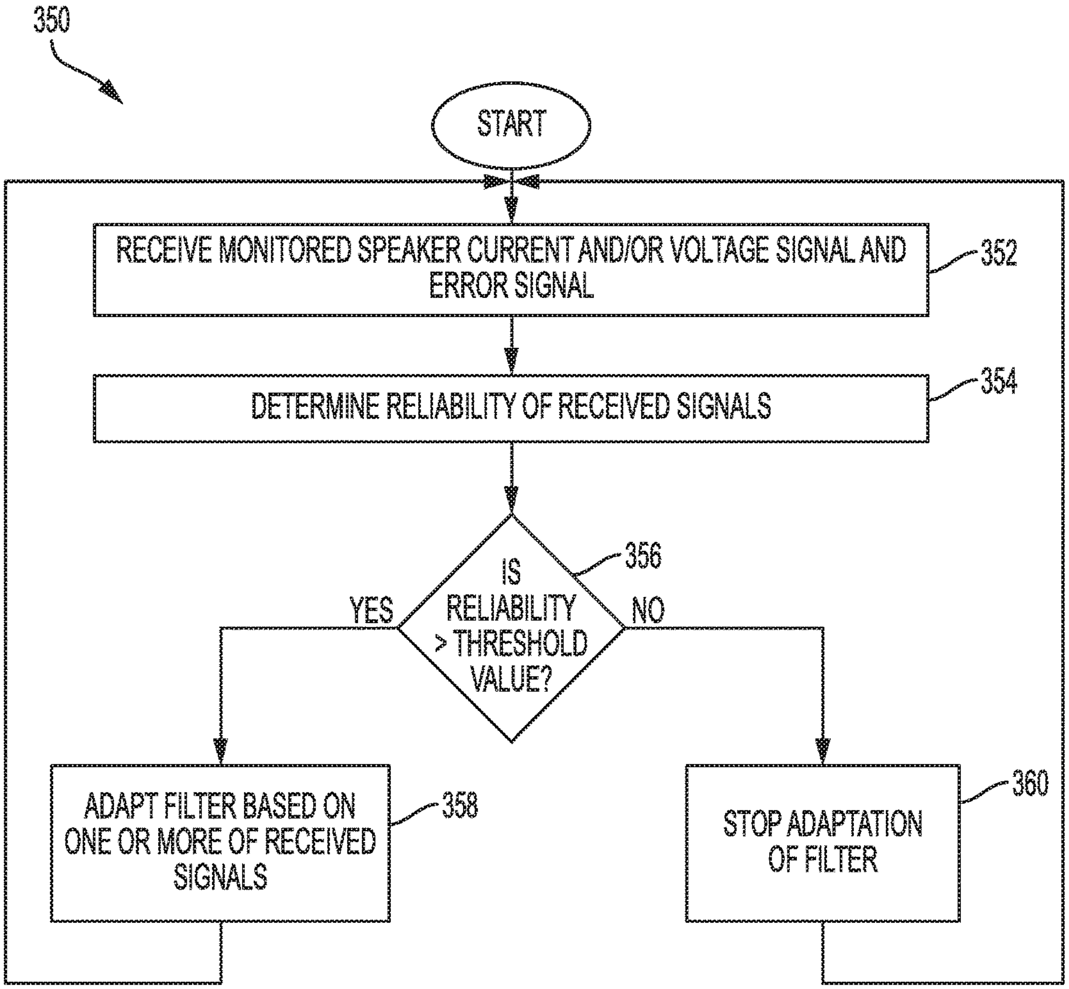
FIG. 3B is a flow chart illustrating an example method for direct voltage-to-excursion speaker modeling with adaptive filter control according to some embodiments of the disclosure.

An algorithm for controlling the adaptive filter with 206 by the adaptive filter control block 310 is illustrated in FIG. 3B. FIG. 3B is a flow chart illustrating an example method for direct voltage-to-excursion speaker modeling with adaptive filter control according to some embodiments of the disclosure. A method 350 may begin at block 352 with receiving one or more signals including monitored speaker and/or voltage values and an error signal. At block 354, a reliability of the signals received at block 352 is determined. Then, at block 356, the reliability of the voltage, current, and/or error signals is compared to criteria, such as a threshold value, to determine if the reliability is sufficient for modifying the adaptive filter to improve the transfer function Hx(s). If so, then the filter is adapted, at block 358, based on one or more of the received signals of block 352. If not, the filter adaptation is stopped at block 360. The method 350 may then repeat to reconsider for new values of the signals received at block 352.

The adaptive filter described above may operate in one of several possible domains. One such domain is the displacement domain, which is described in the embodiments above when the adaptive filter is referred to as a voltage-to-displacement adaptive filter. When the adaptive filter operates in other domains, it may likewise be used to convert directly from an electrical value to a mechanical value. Furthermore, regardless of the domain being operated in, the transfer function of the adaptive filter may be re-used to calculate a predicted excursion value $X_{pred}$, or another mechanical value. In different embodiments, the adaptive filter may operate in the displacement domain or a displacement-related domain. Examples of displacement-related domains are the velocity domain and back electromotive force (back-EMF or bemf) domain, each of which is a mechanical value that may be used to describe operation of a speaker.

Figure 4:
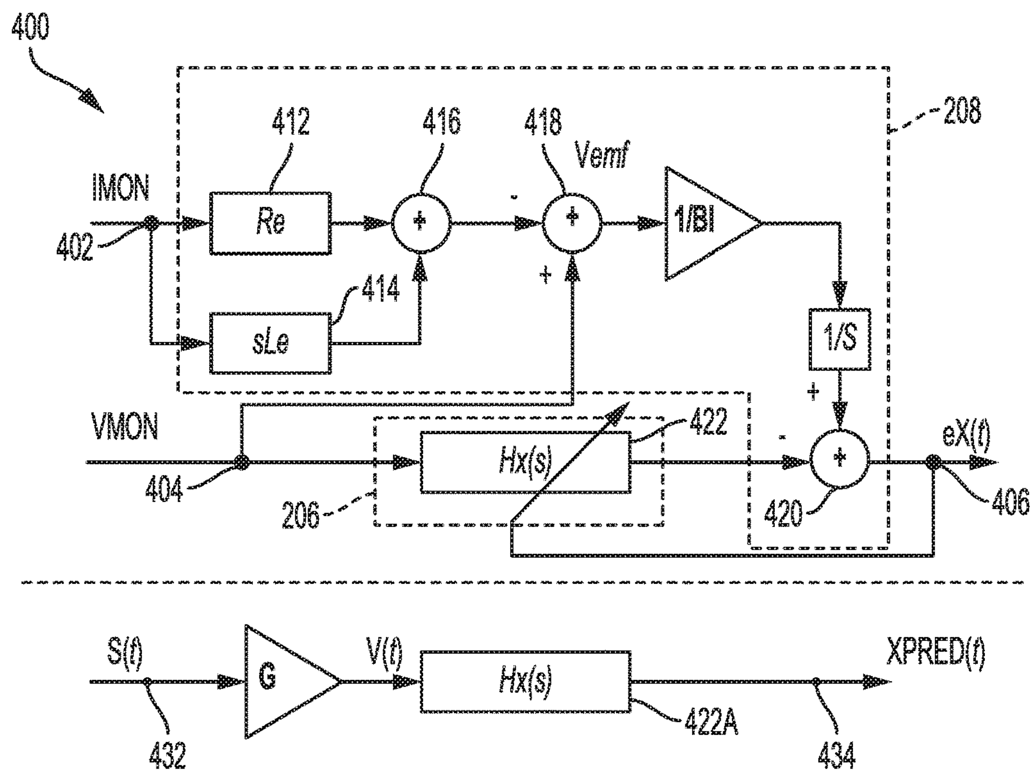
FIG. 4 is an example circuit illustrating direct voltage-to-excursion speaker modeling using an error signal computed in the excursion domain according to some embodiments of the disclosure.

An adaptive filter and error signal estimation block may be configured to operate in a displacement domain as shown in FIG. 4. FIG. 4 is an example circuit illustrating direct voltage-to-excursion speaker modeling using an error signal computed in the excursion domain according to some embodiments of the disclosure. A circuit 400 may receive inputs through input node 402 for a speaker current $I_{spk}$ value, input node 404 for a speaker voltage $V_{spk}$ value, and/or an input node 432 for an audio signal input S(t). An adaptive filter 206 may include electrical-to-displacement conversion block 422 for generating a displacement X(t) value. An output of the adaptive filter 206 is provided to error signal estimation block 208 to generate an error signal eX(t) at output node 406 that is used as a feedback signal for updating the adaptive filter 206. The error signal estimate block 208 may include a resistance calculation block 412 and an inductance calculation block 414 that perform calculations from the speaker current value $I_{spk}$. Although the resistance and inductance values are shown as measured values, these values can be generated by any technique. In some examples, the resistance and inductance may be fixed. In other examples, the resistance and inductance can be updated during operation of the circuit based on $V_{spk}$ and $I_{spk}$ signals. The outputs of blocks 412 and 414 may be combined at adder block 416, which has an output that is subsequently combined with the speaker voltage value $V_{spk}$ at adder block 418. Additional processing is performed to convert the output of adder block 418 to an estimated velocity value $U_{est}(t)$ and then to an estimated displacement value $X_{est}(t)$. The error signal eX(t) may be calculated by adder block 420 combining the estimated displacement $X_{est}(t)$ with a displacement value produced by the adaptive filter 206. The transfer function Hx(s) developed in the adaptive filter 206 may be re-used in processing block 422A. The processing block 422A may be configured to predict values based on the transfer function Hx(s). For example, the processing block 422 may receive an input audio signal S(t) from input node 432 and produce a predicted excursion $X_{pred}(t)$ for output to output node 434.

Operation of the circuit 400 of FIG. 4 tracks changes in excursion characteristics that occur because of changes of the speaker characteristics, which may change as a result of temperature, aging, leakage, port blocking, or other conditions. Speaker variations appear as changes in the $V_{emf}$ signal, and the adaptive operation of the circuit 400 will respond to such changes by modifying the transfer function Hx(s) of adaptive filter 206 until the filter 206 converges, as indicated by a small residual error.

The transfer function Hx(s) can be copied from processing block 422 to processing block 422A whenever the adaptive filter 206 better represents the voltage-to-displacement transfer function of the speaker. Because the transfer function Hx(s) continues to adapt at runtime as the speaker characteristics vary, rules may be programmed in an audio controller that define when to copy an updated transfer function Hx(s) from processing block 422 to processing block 422A for better excursion prediction. For example, the transfer function Hx(s) can be copied periodically (e.g., after a certain time period). As another example, the transfer function Hx(s) can be copied when the error signal 406 decreases below a certain threshold level and remains below the threshold for a certain period of time. As a further example, the transfer function Hx(s) can be copied when a resistance estimate from block 412 changes by a threshold amount. The rule of preference can depend on accuracy criteria (e.g., the maximum tolerated error on $X_{pred}(t)$), or on the computational capability of the controller (e.g., frequent copies of filters coefficients can be expensive), or on stability criteria (e.g., changing filter coefficients can cause audible artifacts and potential instability), or on a combination of the above and other criteria. These operations may be performed in other embodiments of the circuit, such as the example embodiments below for back-EMF (electromotive force) domain and velocity domain.

Figure 5:
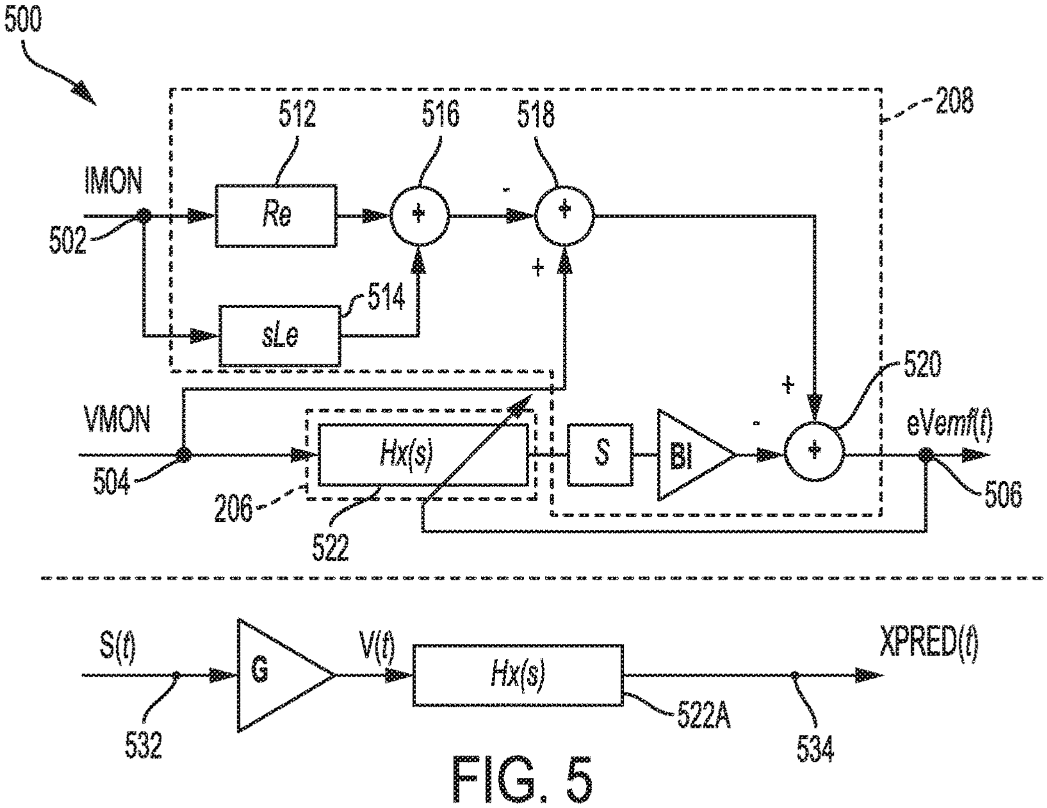
FIG. 5 is an example circuit illustrating direct voltage-to-excursion speaker modeling using an error signal computed in the back-EMF (electromotive force) domain according to some embodiments of the disclosure.

An adaptive filter and error signal estimation block may be configured to operate in a back-EMF (electromotive force) domain as shown in FIG. 5. FIG. 5 is an example circuit illustrating direct voltage-to-excursion speaker modeling using an error signal computed in the back-EMF (electromotive force) domain according to some embodiments of the disclosure. A circuit 500 may receive inputs through input node 502 for a speaker current $I_{spk}$ value, input node 504 for a speaker voltage $V_{spk}$ value, and/or an input node 532 for an audio signal input S(t). An adaptive filter 206 may include electrical-to-displacement conversion block 522 for generating a back-EMF $V_{emf}(t)$ value. An output of the adaptive filter 206 is provided to error signal estimation block 208 to generate an error signal $eV_{emf}(t)$ at output node 506 that is used as a feedback signal for updating the adaptive filter 206. The error signal estimate block 208 may include a resistance calculation block 512 and an inductance calculation block 514 that perform calculations from the speaker current value $I_{spk}$. The outputs of blocks 512 and 514 may be combined at adder block 516, which has an output that is subsequently combined with the speaker voltage value $V_{spk}$ at adder block 518. The output of adder block 518 is an estimated back-EMF value $V_{est}(t)$. The error signal $eV_{emf}(t)$ may be calculated by adder block 520 combining the estimated back-EMF $V_{est}(t)$ with a back-EMF value $V_{emf}(t)$ produced by the adaptive filter 206. The transfer function Hx(s) developed in the adaptive filter 206 may be re-used in processing block 522A. The processing block 522A may be configured to predict values based on the transfer function Hx(s). For example, the processing block 522 may receive an input audio signal S(t) from input node 532 and produce a predicted excursion $X_{pred}(t)$ for output to output node 534.

Figure 6:
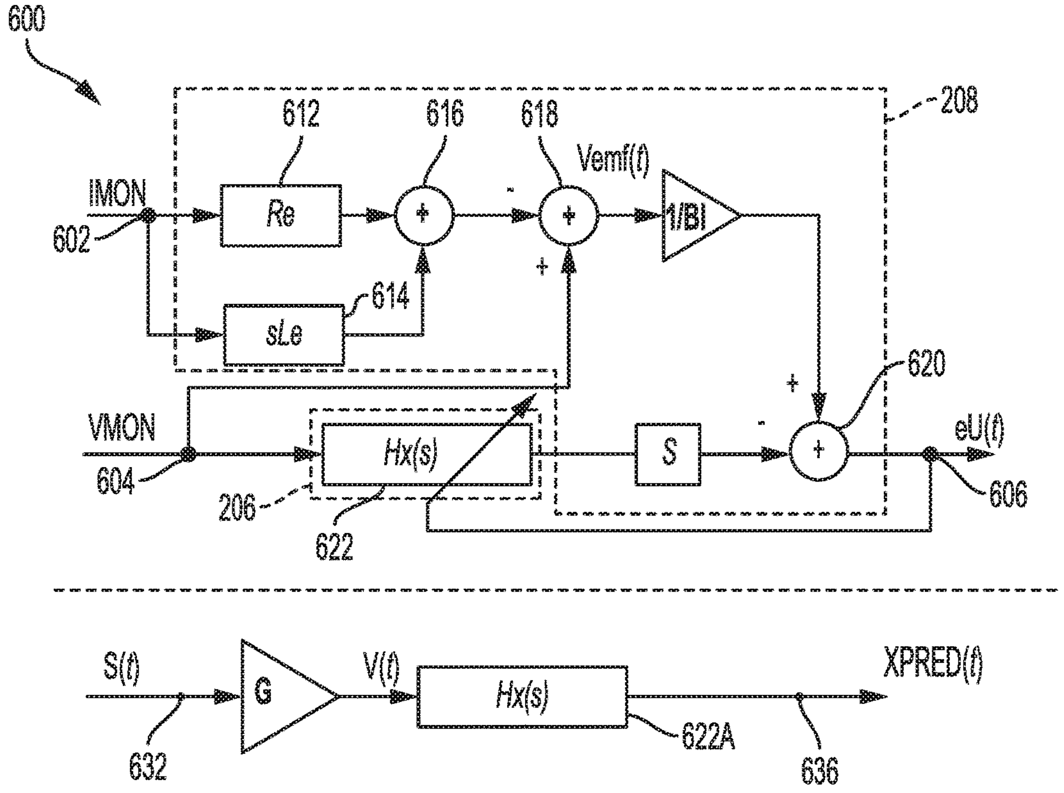
FIG. 6 is an example circuit illustrating direct voltage-to-excursion speaker modeling using an error signal computed in the velocity domain according to some embodiments of the disclosure.

An adaptive filter and error signal estimation block may be configured to operate in a velocity domain as shown in FIG. 6. FIG. 6 is an example circuit illustrating direct voltage-to-excursion speaker modeling using an error signal computed in the velocity domain according to some embodiments of the disclosure. A circuit 600 may receive inputs through input node 602 for a speaker current value $I_{spk}$, input node 604 for a speaker voltage value $V_{spk}$, and/or an input node 632 for an audio signal input S(t). An adaptive filter 206 may include electrical-to-displacement conversion block 622 for generating a velocity U(t) value. An output of the adaptive filter 206 is provided to error signal estimation block 208 to generate an error signal eU(t) that is used as a feedback signal for updating the adaptive filter 206. The error signal estimate block 208 may include a resistance calculation block 612 and an inductance calculation block 614 that perform calculations from the speaker current value $I_{spk}$. The outputs of blocks 612 and 614 may be combined at adder block 616, which has an output that is subsequently combined with the speaker voltage value $V_{spk}$ at adder block 618. Additional processing is performed to convert the output of adder block 618 to an estimated velocity value $U_{est}(t)$. The error signal eU(t) may be calculated by adder block 620 combining the estimated displacement $U_{est}(t)$ with a displacement value U(t) produced by the adaptive filter 206. The transfer function Hx(s) developed in the adaptive filter 206 may be re-used in processing block 622A. The processing block 622A may be configured to predict values based on the transfer function Hx(s). For example, the processing block 622 may receive an input audio signal S(t) from input node 632 and produce a predicted excursion $X_{pred}(t)$ for output to output node 634.

Figure 7:
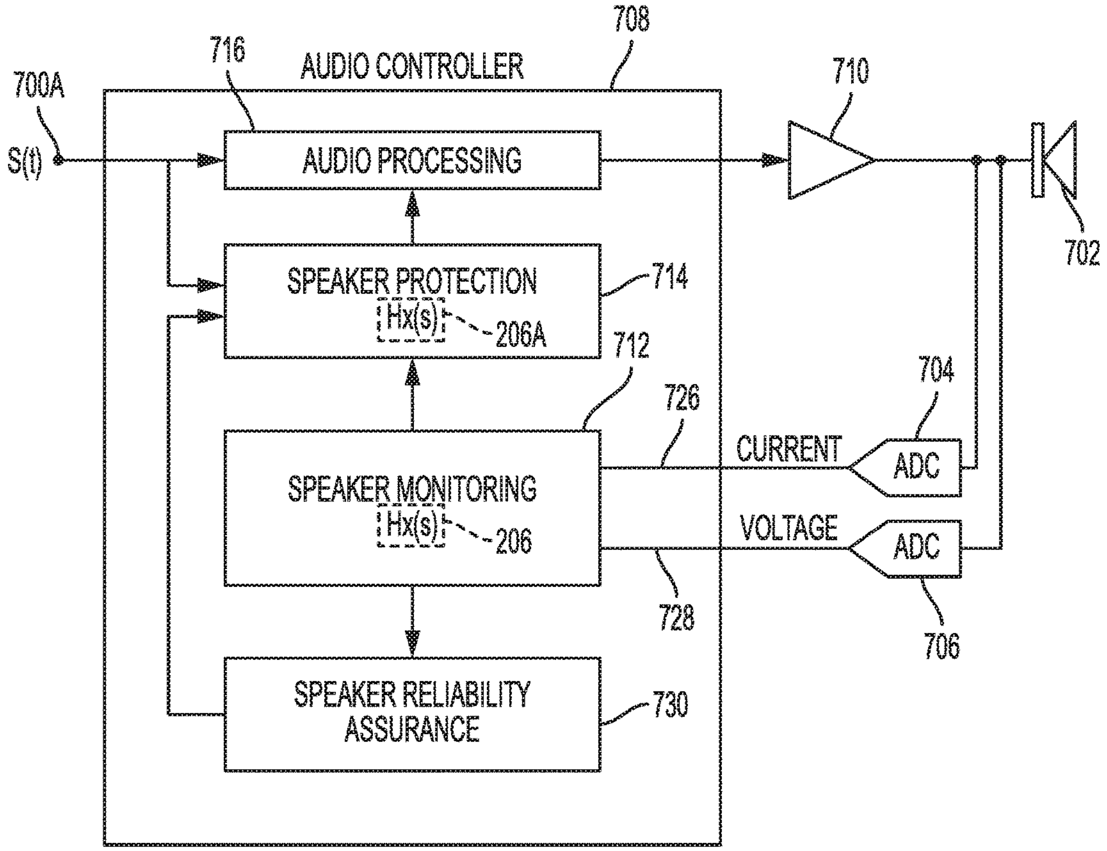
FIG. 7 is a block diagram illustrating an example system that employs an audio controller to control the operation of an audio speaker using a direct electrical-to-mechanical speaker model in accordance with embodiments of the present disclosure.

One example implementation in an audio controller of the direct electrical-to-mechanical conversion by an adaptive filter for speaker protection is shown in FIG. 7. FIG. 7 is a block diagram illustrating an example system that employs an audio controller to control the operation of an audio speaker using a direct electrical-to-mechanical speaker model in accordance with embodiments of the present disclosure. FIG. 7 illustrates a block diagram of an example system 700 that employs an audio controller 708 to control the operation of an audio speaker 702. Audio speaker 702 may be any suitable electroacoustic transducer that produces sound in response to an electrical audio signal input (e.g., a voltage or current signal). The audio speaker 702 may be integrated with a mobile device, such as a microspeaker in a smart phone, or the audio speaker 702 may be integrated in headphones connected to a mobile device. The audio controller 708 may generate the electrical audio signal input for the speaker 702, which may be amplified by amplifier 710 to drive the speaker 702. In some embodiments, one or more components of system 700 may be integrated in a single integrated circuit (IC). For example, the controller 708, the amplifier 710, and ADCs 704 and 706 may be integrated into a single IC. In some embodiments, the single IC may also include an audio coder/decoder (CODEC) configured to decode an analog or digital signal to generate the signal S(t) for input node 700A.

Audio controller 708 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, the controller 708 may interpret and/or execute program instructions and/or process data stored in a memory (not shown) coupled to or integrated with the audio controller 708. The controller 708 may be logic circuitry configured by software or configured with hard-wired functionality that performs the operations of the illustrated modules of FIG. 7, along with other functionality not shown. For example, as shown in FIG. 7, controller 708 may be configured to perform speaker modeling and tracking in module 712, speaker protection in module 714, audio processing in module 716, and/or speaker reliability assurance in module 730.

Amplifier 710, although shown as a single component, may include multiple components, such as a system, device, or apparatus configured to amplify a signal received from the audio controller 708 and convey the amplified signal to another component, such as to speaker 702. In some embodiments, amplifier 710 may include digital-to-analog converter (DAC) functionality. For example, the amplifier 710 may be a digital amplifier configured to convert a digital signal output from the audio controller 708 to an analog signal to be conveyed to speaker 702.

The audio signal communicated to speaker 702 may be sampled by each of an analog-to-digital converter (ADC) 704 and an analog-to-digital converter (ADC) 706 and used as feedback within the audio controller 708. For example, ADC 704 may be configured to detect an analog current value $I_{spk}$ and ADC 706 may be configured to detect an analog voltage value $V_{spk}$. These analog values may be converted to digital signals by ADCs 704 and 706 and conveyed to the audio controller 708 as digital signals 726 and 728, respectively. Based on digital current signal 726 and digital voltage signal 728, the audio controller 708 may perform speaker monitoring 712 to generate modeled parameters (e.g., parameters indicative of a displacement associated with audio speaker 702 and/or a temperature associated with audio speaker 702, and/or parameters indicative of a force factor, a stiffness, damping factor, and/or resonance frequency associated with audio speaker 702) for speaker 702. Some or all modeled parameters may be conveyed to a speaker reliability assurance block 730 and/or a speaker protection block 714. Based on the modeled parameters, specifications from manufacturer of the transducer, and/or offline reliability testing of audio speakers similar (e.g., of the same make and model) to audio speaker 702, the audio controller 708 may perform speaker reliability assurance 730 to generate speaker protection thresholds. Such speaker protection thresholds may include, without limitation, an output power level threshold for audio speaker 702, a displacement threshold associated with audio speaker 702, and/or a temperature threshold associated with audio speaker 702.

The audio controller 708 may perform speaker protection 714 based on one or more operating characteristics of the audio speaker, including modeled parameters 718 and/or the audio input signal. For example, speaker protection 714 may compare modeled parameters (e.g., a predicted displacement and/or modeled resistance of audio speaker 702) to corresponding speaker protection thresholds (e.g., a displacement threshold and/or a temperature threshold), and based on such comparison, generate control signals for gain, bandwidth, and virtual bass conveyed as signals to the audio processing circuitry 716. For example, when a predicted displacement exceeds a speaker protection threshold, a gain for an amplifier driving the audio speaker 702 may be decreased to prevent damage to the speaker. As another example, when a predicted displacement is below a safety margin from the speaker protection threshold, a gain for an amplifier driving the audio speaker 702 may be increased to further overdrive the audio speaker 702.

As described above, an adaptive filter 206 may be implemented to develop a transfer function Hx(s) capable of performing an electrical-to-mechanical conversion for modeling the speaker. The adaptive filter 206 may be implemented in speaker monitoring block 712, which updates the transfer function Hx(s) of the adaptive filter using the current signal 726 and voltage signal 728 as described with reference to FIG. 2 and FIG. 3. The transfer function Hx(s) may be replicated as processing block 206A in speaker protection block 714. The speaker protection block may use the transfer function Hx(s) to predict excursion or another mechanical value based on an input signal S(t) received at input node 700A. The predicted excursion may be compared to thresholds established by the speaker reliability assurance block 730. Based on such a comparison, the speaker protection block 714 may generate control signals for, e.g., gain, bandwidth, and virtual bass, for controlling the audio processing circuitry 716 to reduce damage to the speaker 702. Thus, by comparing a modeled displacement or a predicted displacement to an associated displacement threshold, speaker protection 714 may reduce gain to reduce the intensity of the audio signal communicated to speaker 702 and/or control bandwidth in order to filter out lower-frequency components of the audio signal which may reduce displacement of audio speaker 702, while causing virtual bass to virtually add such filtered lower-frequency components to the audio signal.

In addition to performing speaker protection 714 based on comparison of one or more operating characteristics of speaker 702, speaker monitoring 712 may ensure that speaker 702 operates under an output power level threshold for audio speaker 702. In some embodiments, such output power level threshold may be included within speaker protection thresholds conveyed to the speaker protection block 714 by the speaker reliability assurance block 730.

Figure 8:
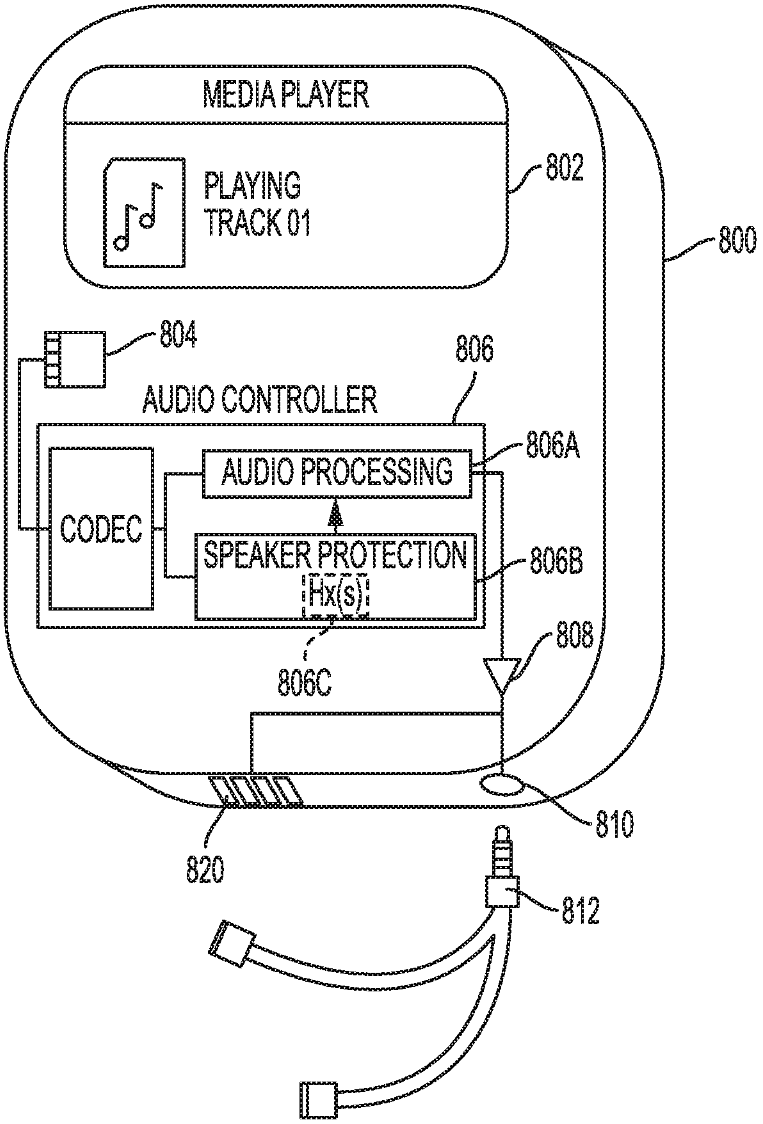
FIG. 8 is an illustration showing an example personal media device for audio playback including an audio controller that is configured to perform speaker protection using a direct electrical-to-mechanical speaker model according to one embodiment of the disclosure.

One advantageous embodiment for an audio processor described herein is a personal media device for playing back music, high-fidelity music, and/or speech from telephone calls. FIG. 8 is an illustration showing an example personal media device for audio playback including an audio controller that is configured to perform speaker protection using a direct electrical-to-mechanical speaker model according to one embodiment of the disclosure. A personal media device 800 may include a display 802 for allowing a user to select from music files for playback, which may include both high-fidelity music files and normal music files. When music files are selected by a user, audio files may be retrieved from memory 804 by an application processor (not shown) and provided to an audio controller 806. The audio controller 806 may include audio processing circuitry 806 and speaker protection circuitry 806B. The speaker protection circuitry 806B may implement a processing block 806C having a transfer function Hx(s) developed by a speaker monitoring block (not shown), such as according to the embodiments of FIG. 2 and FIG. 3. The digital audio (e.g., music or speech) may be converted to analog signals by the audio controller 806, and those analog signals amplified by an amplifier 808. The amplifier 808 may be coupled to an audio output 810, such as a headphone jack, for driving a transducer, such as headphones 812. The amplifier 808 may also be coupled to an internal speaker 820 of the device 800. Although the data received at the audio controller 806 is described as received from memory 804, the audio data may also be received from other sources, such as a USB connection, a device connected through Wi-Fi to the personal media device 800, a cellular radio, an Internet-based server, another wireless radio, and/or another wired connection.

The schematic flow chart diagrams of FIGS. 2B and 3B are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. In some embodiments, the integrated circuit (IC) that is the controller may include other functionality. For example, the controller IC may include an audio coder/decoder (CODEC) along with circuitry for performing the operations described herein. Such an IC is one example of an audio controller. Other audio functionality may be additionally or alternatively integrated with the IC circuitry described herein to form an audio controller.

If implemented in firmware and/or software, operations described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the operations outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although digital signal processors (DSPs) are described throughout the detailed description, aspects of the invention may be implemented on other processors, such as graphics processing units (GPUs) and central processing units (CPUs). As another example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:

receiving a current and a voltage for a transducer;

converting the voltage to a converted displacement value using a voltage-to-displacement adaptive filter;

determining an error signal based on the current, the voltage, and the converted displacement value; and updating the voltage-to-displacement adaptive filter using the error signal.

2. The method of claim 1, further comprising:

determining a back-EMF voltage based on the current and the voltage for the transducer, wherein the step of determining the error signal comprises:

determining an estimated displacement signal for the transducer based on the back-EMF voltage; and determining the error signal by combining the estimated displacement signal with the converted displacement value.

3. The method of claim 1, comprising:

determining a back-EMF voltage based on the current and the voltage through the transducer, wherein the step of determining the error signal comprises:

determining an estimated displacement-related signal for the transducer based on the back-EMF voltage; and determining the error signal by combining the estimated displacement-related signal with the converted displacement value.

4. The method of claim 1, further comprising reusing a transfer function of the voltage-to-displacement adaptive filter for a computation of another value.

5. The method of claim 1, further comprising reusing the transfer function of the voltage-to-displacement adaptive filter for a computation of a diaphragm excursion for the transducer.

6. The method of claim 5, further comprising updating the transfer function for the determination of the diaphragm excursion based on defined rules.

7. The method of claim 5, further comprising using the prediction of the diaphragm excursion for speaker protection.

8. The method of claim 1, further comprising determining a speaker type of the transducer based, at least in part, on the error signal.

9. The method of claim 8, wherein determining the speaker type comprises determining whether the transducer is ported or sealed.

10. The method of claim 1, further comprising:

determining a reliability of adaptive filter updates based, at least in part, on a reliability of the current, the voltage, and the error signal; and stopping the updating of the voltage-to-displacement adaptive filter when the reliability is below a threshold level.

11. The method of claim 1, wherein the estimated error signal is determined without information regarding mechanical parameters related to moving mass, stiffness, and mechanical resistance of the transducer.

12. An apparatus, comprising:

an audio controller configured to perform steps comprising:

receiving a current and a voltage for a transducer;

converting the voltage to a converted displacement value using a voltage-to-displacement adaptive filter;

determining an error signal based on the current, the voltage, and the converted displacement value; and updating the voltage-to-displacement adaptive filter using the error signal.

13. The apparatus of claim 12, wherein the audio controller is further configured to perform the step of determining a back-EMF voltage based on the current and the voltage through the transducer, wherein the step of determining the error signal comprises:

determining an estimated displacement signal for the transducer based on the back-EMF voltage; and determining the error signal by combining the estimated displacement signal with the converted displacement value.

14. The apparatus of claim 12, wherein the audio controller is further configured to perform the step of determining a back-EMF voltage based on the current and the voltage through the transducer, wherein the step of determining the error signal comprises:

determining an estimated displacement-related signal for the transducer based on the back-EMF voltage; and determining the error signal by combining the estimated displacement-related signal with the converted displacement value.

15. The apparatus of claim 12, wherein the audio controller is further configured to apply a transfer function of the voltage-to-displacement adaptive filter for a determination of another value.

16. The apparatus of claim 12, wherein the audio controller is configured to apply the transfer function for a determination of diaphragm excursion.

17. The apparatus of claim 16, wherein the audio controller is configured to update a transfer function for the determination of diaphragm excursion based on defined rules.

18. The apparatus of claim 16, wherein the prediction of diaphragm excursion is used for speaker protection.

19. The apparatus of claim 12, wherein the audio controller is further configured to determine a speaker type of the transducer based, at least in part, on the error signal.

20. The apparatus of claim 19, wherein the audio controller is configured to determine whether the transducer is ported or sealed.

21. The apparatus of claim 12, wherein the audio controller is further configured to perform steps comprising:

determining a reliability of adaptive filter updates based, at least in part, on a reliability of the current, the voltage, and the error signal; and stopping the updating of the voltage-to-displacement adaptive filter when the reliability is below a threshold level.

22. The apparatus of claim 12, wherein the estimated error signal is determined without information regarding mechanical parameters related to moving mass, stiffness, and mechanical resistance of the transducer.

* * * * *